United States Patent [19]

Pharo, Jr. et al.

[11] Patent Number: 5,353,260
[45] Date of Patent: Oct. 4, 1994

[54] NOISE SIGNAL PROCESSOR

[75] Inventors: Lawrence C. Pharo, Jr., State College; John J. Portelli, Boalsburg, both of Pa.

[73] Assignee: The United States of America as represented by the Secretary of the Navy, Washington, D.C.

[21] Appl. No.: 378,444

[22] Filed: May 13, 1982

[51] Int. Cl.⁵ .............................................. G01S 15/00
[52] U.S. Cl. ..................................... 367/135; 367/901
[58] Field of Search ................ 324/77 B, 77 E, 76.46; 367/135, 901; 455/250, 245, 250.1, 245.1

[56] References Cited

U.S. PATENT DOCUMENTS

| | | | |
|---|---|---|---|
| 3,290,592 | 12/1966 | Pharo, Jr. et al. | 367/135 X |
| 3,320,576 | 5/1967 | Dixon et al. | 367/135 |
| 3,896,411 | 7/1975 | Mackey et al. | 367/901 X |
| 4,083,031 | 4/1978 | Pharo, Jr. | 367/901 X |

Primary Examiner—Daniel T. Pihulic
Attorney, Agent, or Firm—David S. Kalmbaugh; Melvin J. Sliwka; John Forrest, Jr.

[57] ABSTRACT

Apparatus for providing a direct quantitative readout of the amplitudes of various frequency lines that constitute the envelope of an amplitude-modulated broadband noise signal. A selected band of carrier frequencies is fed to an AGC circuit that provides a constant-input signal amplitude to a demodulator for a period of time that is greater than the period of the lowest frequency of the modulating signal for detection. The detected signal is fed to a spectrum analyzer for the direct reading of the percent modulation.

10 Claims, 7 Drawing Sheets

NOISE SIGNAL PROCESSOR

BACKGROUND OF THE INVENTION

The present invention relates to signal processing and more particularly to signal processing of amplitude-modulated broadband noise signals.

In the detection and identification of selected modulated broadband noise signals, such as those generated by underwater driven equipment, it is desirable to have a quantitative measurement of the level of modulation. This allows for the immediate reaction to searching for and identifying the sources of the broadband noise supporting the modulation. Demodulation systems of this type presently in use do not have the sensitivity for short time samples to indicate the presence of the desired signal. Neither do they provide the actual amplitude of the modulating signal. Usually the frequency of the modulation line is a darkened trace on continuously moving paper and the level of modulation is a function of the darkness of the line trace. The time to develop the trace requires several minutes.

SUMMARY OF THE INVENTION

The present invention provides a noise signal processor which fulfills the need for a direct quantitative readout of the amplitudes of various frequency lines that constitute the envelope of an amplitude modulated broadband noise signal. Noise signals containing the modulation characteristics of various water-borne devices and ships ranging from low-level hydrophone output signals to the output of linedrivers and magnetic tape recorders are processed. The noise signal is amplified (if required) and fed to a band of filters where selection is made of noise bands known to contain modulation information of interest in most radiated-noise measurements. The output of the selected filter is fed to an automatic gain control circuit (AGC) which maintains the level of the noise signal at an optimum level for detection. Monitoring means are provided for indicating to a person operating the equipment the amplitude of the signal being processed.

Accordingly, an object of the invention is the provision of noise signal processing means that will output a signal that in conjunction with a spectrum analyzer will give a direct quantitative readout of the amplitudes of various frequency lines contained in the noise signal being processed.

Another object of the invention is the provision of noise signal processing means that will display the actual level of modulation of the noise signal being monitored in times measured in seconds as opposed to prior known devices that require time measured in minutes.

Other objects, advantages and novel features of the invention will become apparent from the following detailed description of the invention when considered in conjunction with the accompanying drawings wherein:

Figure 1:
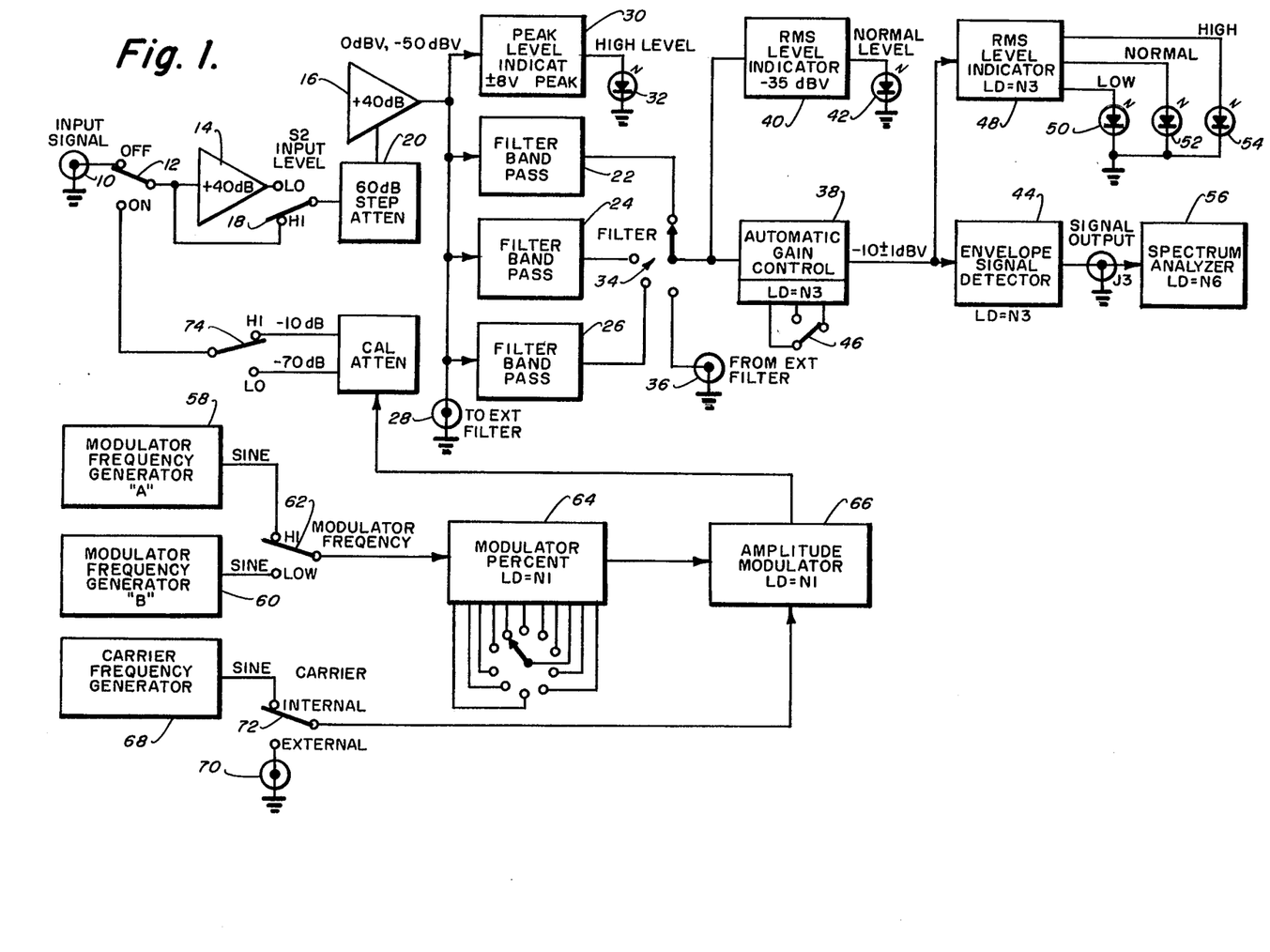
FIG. 1 is an overall block diagram of a noise-signal processing circuit embodying the invention.

Referring now to the drawings wherein there is shown in FIG. 1 an input terminal 10 for receiving signals ranging from low-level hydrophone output signals to the output of line drivers and tape recorders.

In the normal mode of operation (calibrator off), input signals are fed by means of switch 12 to preamplifiers 14 and 16 or to preamplifier 16 only. If the input signal is greater than a predetermined value (in the embodiment shown, $-45$ dBv), switch 18 is moved to the high position and the signal is fed through a step attenuator 20 to preamplifier 16. In the embodiment shown, attenuator 20 has sixty dB of attenuation in steps of ten dB.

After amplification, the signal is fed to three band pass filters 22, 24 and 26 and to terminal 28 to which an external variable filter may be connected. The signal is also fed to a peak level detector 30, which provides an output to light emitting diode (LED) 32 to indicate an overload if there are any positive peaks above $+8$ volts or negative peaks below $-8$ volts. In the embodiment shown, filter 22 has a band pass of 2–4 kHz, filter 24 has a bandpass of 4–8 kHz and filter 26 has a bandpass of 8–16 kHz. Selection of a particular filter is by means of a rotary switch 34. An external filter may be connected between terminals 28 and 36.

The selected bandpass signal is fed to AGC circuit 38 and to the RMS level detector 40. LED 42 emits light as long as there is sufficient signal level in the band of interest to operate the AGC circuits 38. A trip level of $-35$ dBV was chosen to allow a 10 dBV safety margin between the normal level indication by LED 42 and the loss of AGC action, which occurs at about $-45$ dBV.

AGC circuit 38 provides an output signal to detector 44 that has a constant amplitude for a period of time that is greater than the period of the lowest frequency of the modulating signal. One of two time constants can be selected by means of switch 46.

Since it is important that the input signal to detector 44 be constant, proper operation of AGC 38 is monitored with the aid of RMS level detector 48 and LEDs 50, 52 and 53. When AGC 28 output is within 1 dB of 10 dBV, LED 52 is lit, indicating proper AGC. An input signal so low in level that AGC 38 cannot properly provide the desired signal level, LED 50 is lit. A large signal out of the range of control for AGC 38 will cause LED 54 to illuminate. These low and high level indications occur at $-11$ dBV and $-9$ dBV respectively, which corresponds to $-45$ dBV to $+15$ dBV levels at the input to AGC 38.

The output signal is detected by envelope detector 44 and the detected signal is such that it can be fed directly to spectrum analyzer 56.

In the calibrate mode, switch 12 is switched to the "ON" position so that the input signal comes from the calibration signal generator.

As shown in FIG. 1, two sine wave signal generators 58 and 60 are provided so that an operator may choose low-frequency modulation (1 HZ) or high-frequency modulation (20 Hz) by means of switch 62. The modulating signal chosen is attenuated by means of precision step attenuator 64 to produce the modulating signal levels required for the ten available modulation indices.

Carrier signals for modulator 66 are supplied from either sine wave generator 68 (12 kHz nominal) or from any external signal at input terminal 70 by means of selector switch 72. Amplitude modulation is accomplished by multiplication of the carrier and envelope signals and reinsertion of the carrier signal to produce double sideband AM, with carrier. The AM signal is attenuated to a level of −10 dBV or −70 dBV as selected by switch 74.

Figure 2:
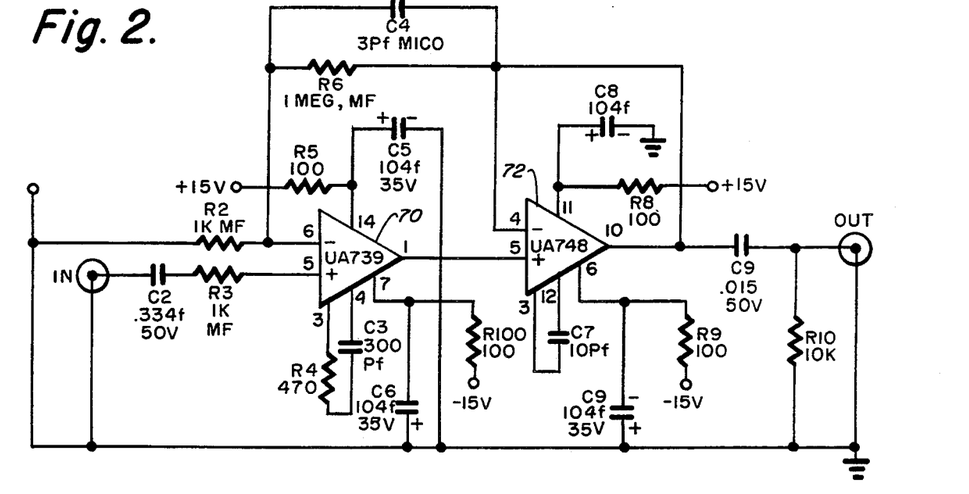
FIG. 2 is a schematic diagram of the preamplifier/amplifier of FIG. 1.

Referring to FIG. 2, there is shown a schematic diagram of amplifier 16. The preamplifier 14 (FIG. 1) is a 40-dB fixed-gain amplifier and may be an Ithaco, model 144E, low-noise amplifier. Amplifier 16 consists of a low-noise operational amplifier 70 which may be a UA739 and a source follower 72 which may be a UA748 for low impedence output. A non inverting input configuration is used for amplifier 70 with AC coupling on the input and output. Resistor R4 and capacitor C3 form a frequency compensation network and results in a 50 dB/decade rolloff above 300 kHz. Low-frequency response is determined by C9 and R10 and is 3 dB down at approximately 500 Hz. Also, the feedback loop for amplifier 70 includes source follower 72.

Figure 3:
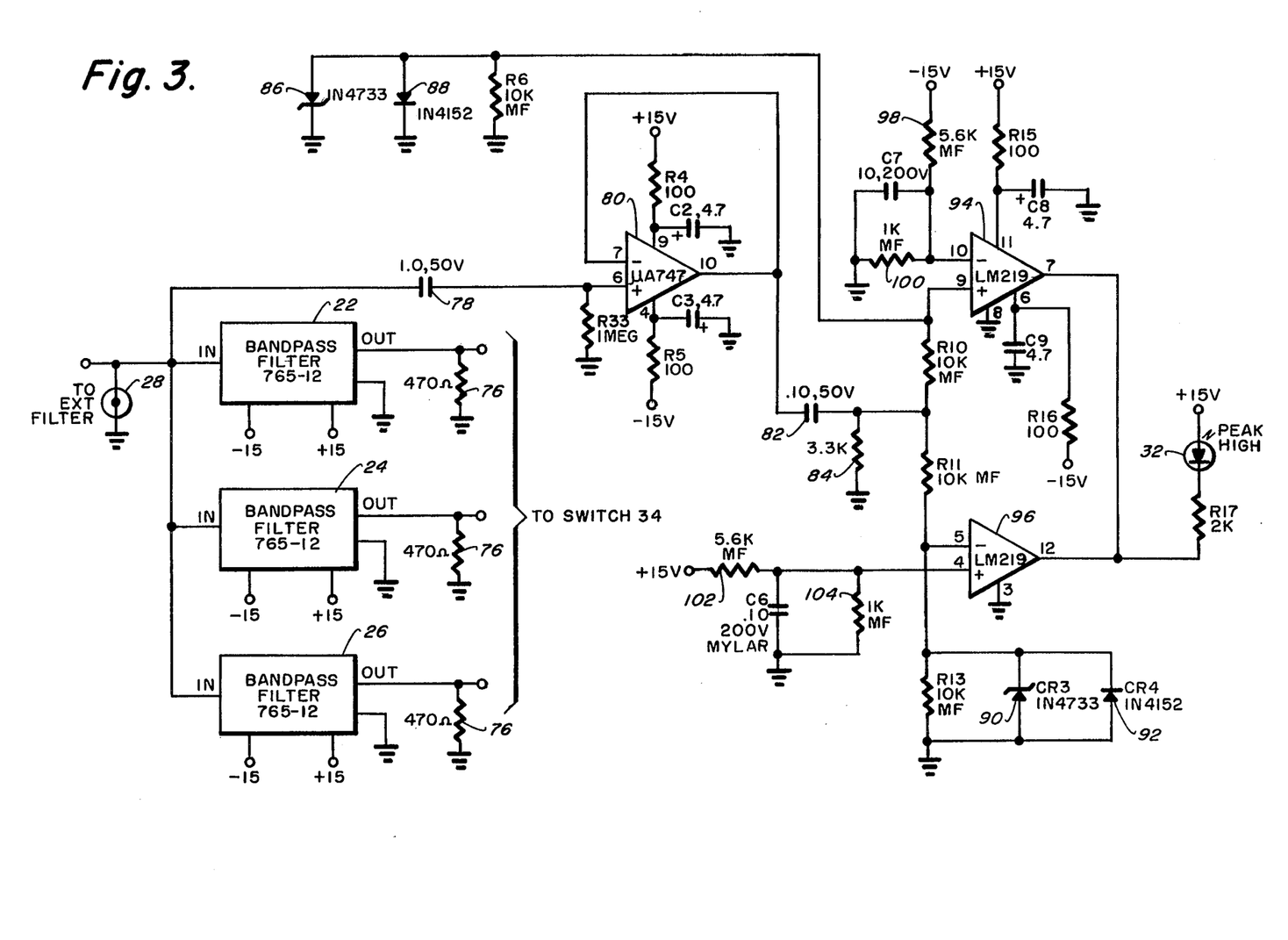
FIG. 3 is a schematic diagram of the filter bank and driver for the high RMS level indicator circuit of FIG. 1.

Referring to FIG. 3 which shows the filter bank and the driver circuit for LED 32. Inputs of all filters are connected in parallel, and the desired output is selected by switch 34 (FIG. 1). A load resistor 76 is connected across the output of each filter to provide termination for the filters not being used. The signal input is also coupled through capacitor 78 to operational amplifier 80 which provides low-impedance drive to the low-frequency rolloff network of capacitor 82 and resistor 84. This signal is then rectified by diodes 86, 88, 90 and 92 to produce both positive and negative outputs to represent the positive and negative peaks of the filter input signal. Operational amplifiers 94 and 96 provide a comparator window with the positive trip level set by resistors 98 and 100 and the negative trip level set by resistors 102 and 104. The outputs of amplifiers 94 and 96 are connected together so that input peaks exceeding either positive or negative trip levels cause the output to fall to −15 Vm, which lights LED 32.

Figure 4:
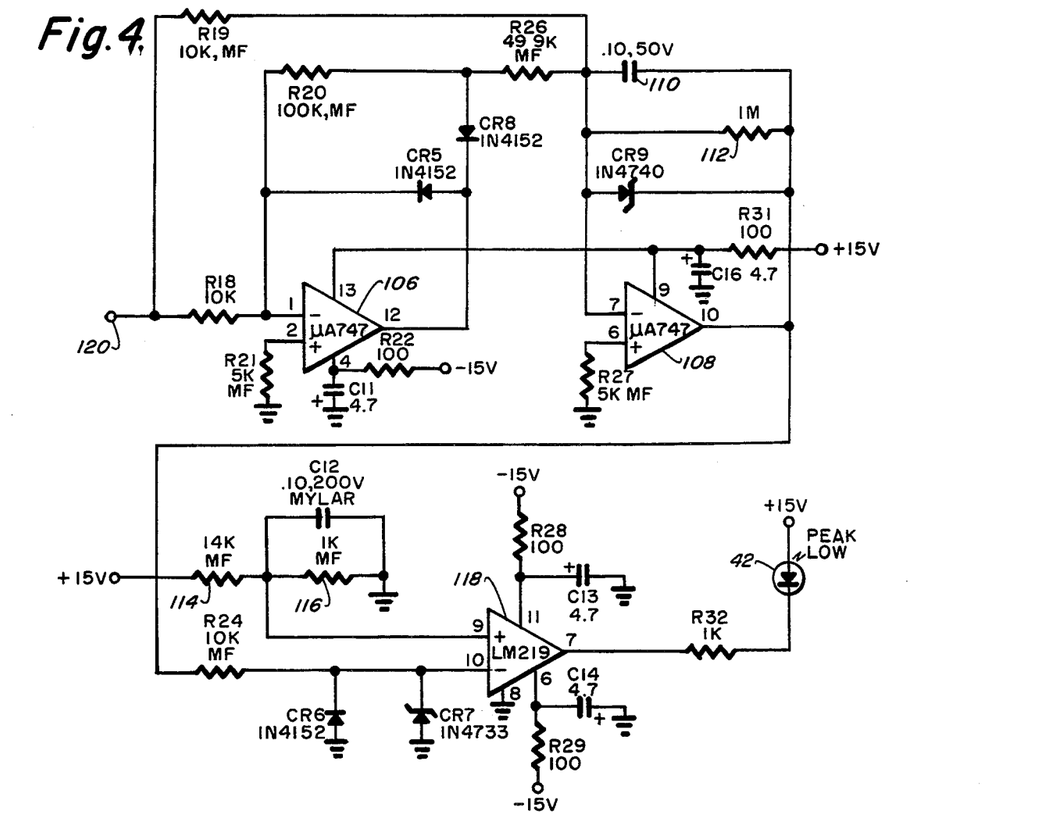
FIG. 4 is a schematic diagram of the driver circuit for the AGC input level indicator.

FIG. 4 is the driver circuit for LED 42. Signals from the output of the selected filter are fed to the negative inputs of operational amplifiers 106 and 108 which form an RMS detector circuit with a time constant determined by capacitor 110 and resistor 112. The output of the detector is compared with a set point (determined by resistors 114 and 116) by comparator 118. LED 42 will illuminate for filter output signals greater than −35 dBV. A 10-dB safety margin is then provided over the −45 dBV necessary to drive the following stage.

Figure 5:
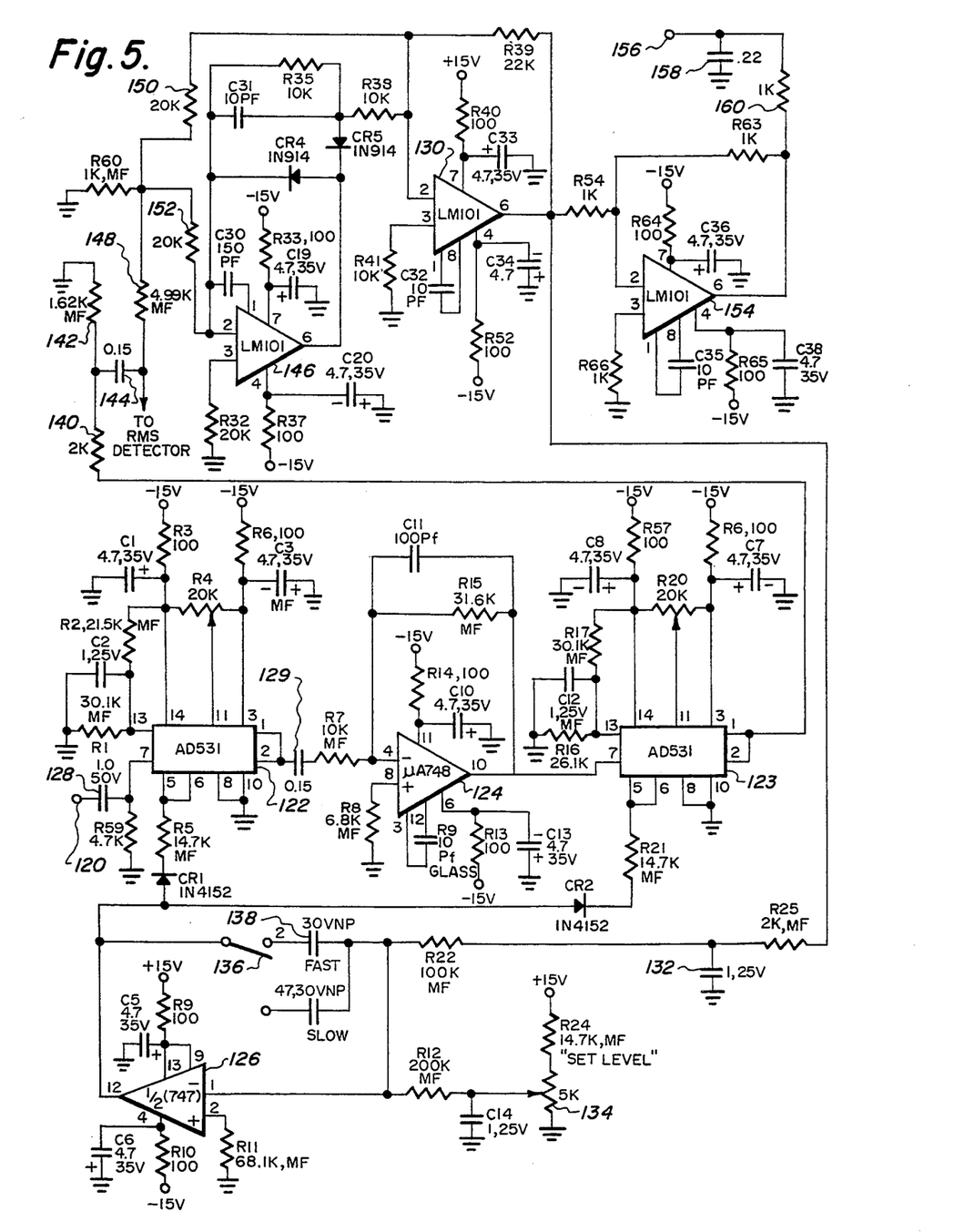
FIG. 5 is a schematic diagram of the automatic gain control circuit of FIG. 1.

Output from the selected filter at terminal 120 is fed to the AGC circuit shown in FIG. 5. The required 60 dB of automatic gain is accomplished by programmable multipliers 122 and 123 and integrators 124 and 126. In the configuration shown, multipliers 122 and 123 perform the function $V_xV_y/kI_z$, where $kI_z$ is the loop control voltage. The input signal at terminal 120 is AC-coupled by capacitor 128 to the $V_x$ input (terminal 7) of multiplier 122. The $V_y$ input (terminal 13) of multiplier 122 is biased to provide approximately half the required gain. Capacitor 128 provides the 500 Hz low-frequency rolloff, and integrator 124 rolls off high frequencies at 60 kHz. The remaining gain results from multiplier 123 which is configured similar to multiplier 122. Since the same control voltage is used for both multipliers, and the multiplier function is $V_xV_y/V_z$, the overall gain varies as the inverse square of $V_z$.

The AGC control voltage Vz is derived from the sum of the signal detector (operational amplifiers 130 and 146) output and a preset DC level that sets the controlled output signal level. The rectified output signal from operational amplifier 130 is filtered by capacitor 132. Integrator 126 sums this feedback voltage with a DC bias from resistor 134 and then integrates the sum with a time constant selected by switch 136, depending on the envelope frequencies encountered in analysis. Capacitor 138 is used for the fast time constant and capacitor 140 is used as the slow time constant. It is important to ensure that the AGE does not follow the modulation envelope; therefore, the long or slow time constant must be selected for low envelope frequencies. Integrator 126 inverts its input signals, therefore, the negative of the output signal is used for AGC control. Resistors 140 and 142 at the output of multiplier 123 are for reducing the signal level to avoid saturation of the signal detector, and capacitor 144 is adjusted for 500-Hz low-frequency rolloff.

Operational amplifiers 130 and 146 form a precision full-wave rectifier with excellent symmetry from DC to 100 kHz. The output signal from multiplier 123 which is filtered and amplitude-controlled is coupled to amplifiers 130 and 146 through capacitor 144, resister 148 and resistors 150 and 152, respectively. The negative-going full-wave-rectified output appears at pin 6 of amplifier 130. To provide a positive-going wave form for the spectrum analyzer, the output signal from amplifier 130 is fed to amplifier 154. The positive-going wave form from amplifier 154 is fed to output terminal 156 with low-pass filter (capacitor 158 and resistor 160) limiting the frequency of the envelope.

Figure 6:
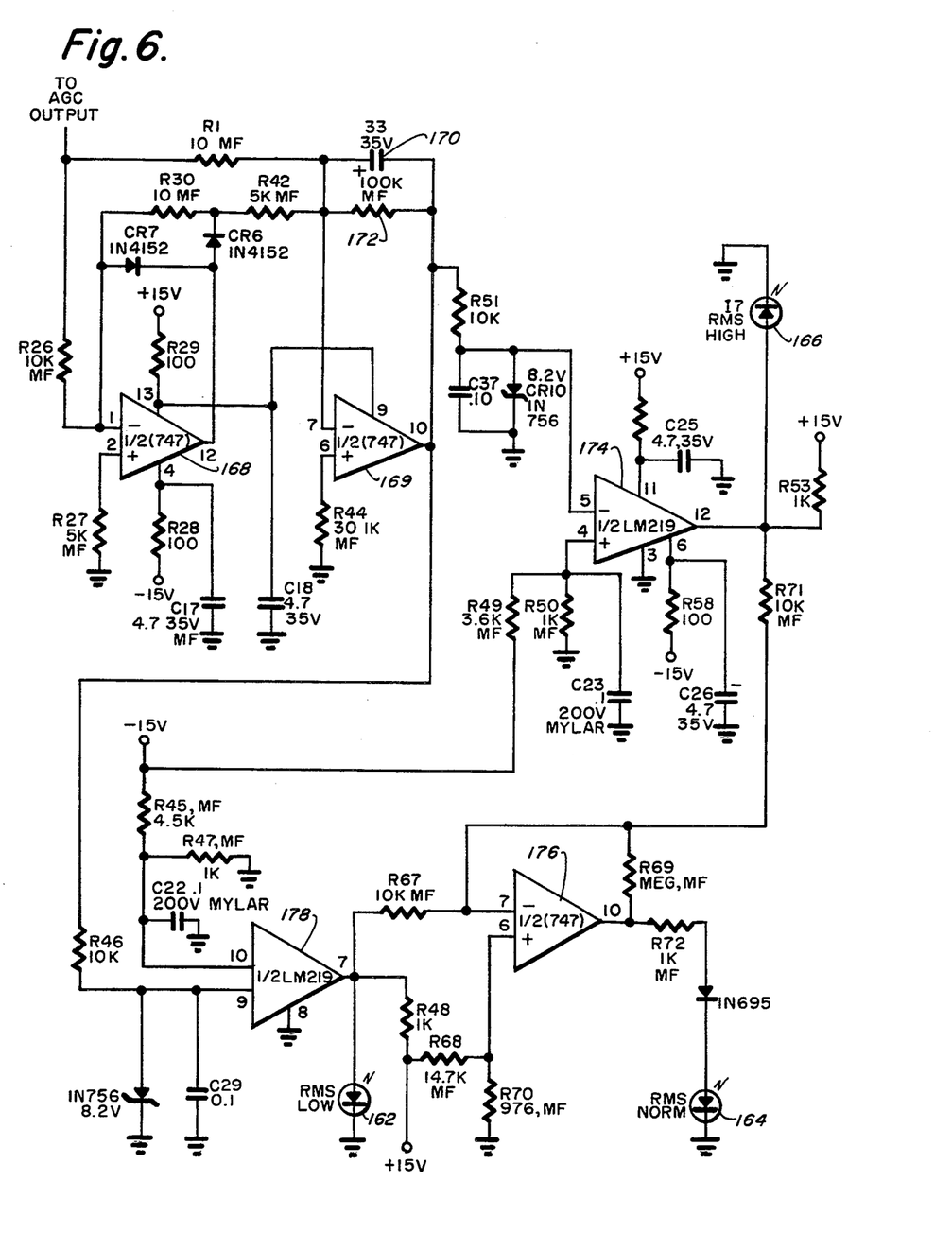
FIG. 6 is a schematic diagram of the detector circuit of FIG. 1.

The RMS level indicator circuitry is shown in FIG. 6. A group of three LED indicators 162, 164 and 166 provides a LOW, NORM, or HIGH indication of the signal level at the output of multiplier 123. For acceptable analysis, this level must be within +1 dB of −10 dBV so that the only amplitude variations in the detector input signal are those resulting from the modulation envelope. RMS detector (consisting of operational amplifiers 168 and 169) samples the output signal from the AGC where it is AC coupled through capacitor 144 (FIG. 5). The time response of detectors 168 and 169 are controlled by the time constant of capacitor 170, resistor 172 network. A DC voltage representative of the RMS value of the AGC output signal appears at pin 10 of detectors 168 and 169. Detectors 168 and 169 have some gain so that level comparators 174, 176 and 178 that follow can operate at a level of several volts rather than the approximately 300 mv, corresponding to −10 dBV. The output of comparator 174 is held at −15 V by the negative 3.2 V reference on pin 4 until the input at pin 5 is more negative than the voltage at pin 4. The output at pin 12 then goes to −15 V, lighting LED 166, for a HIGH level indication. Comparator 178 operates in a similar manner, except that its output goes to +15 V for inputs more positive than its reference voltage, providing a LOW level indication by lighting LED 162. Comparator 176 is used as an analog NOR gate with the outputs of comparators 174 and 178 as inputs. If both of these inputs are low, indicating that the AGC output signal is within the acceptable limits (±1 dBV), the output of comparator 176 is high and LED 164 is illuminated. If either input is high, indicating that the AGC signal is out of range, the NORM indicator will remain off.

Figure 7A:
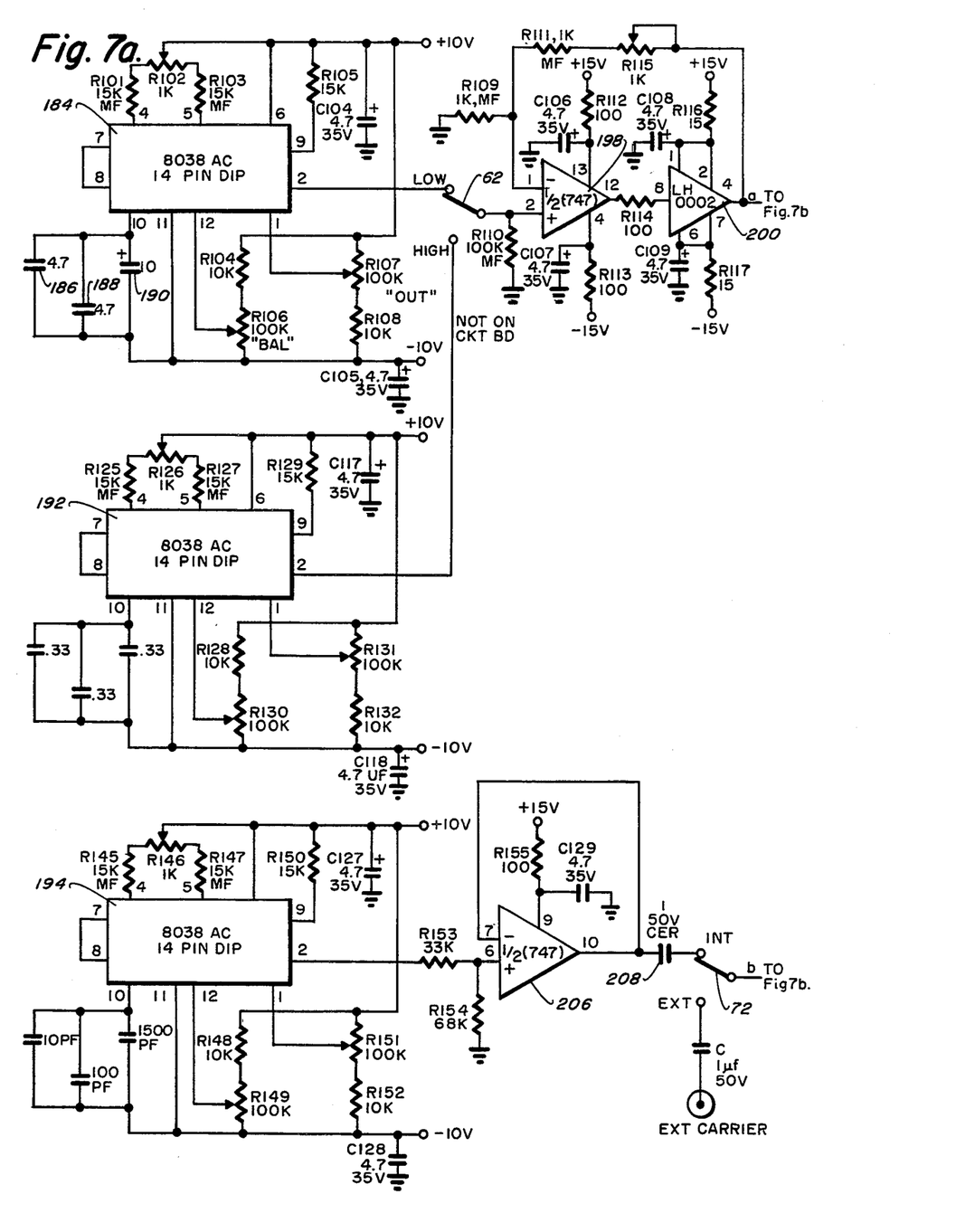
FIGS. 7a and 7b are a schematic diagram of the calibration generator of FIG. 1.
Figure 7B:
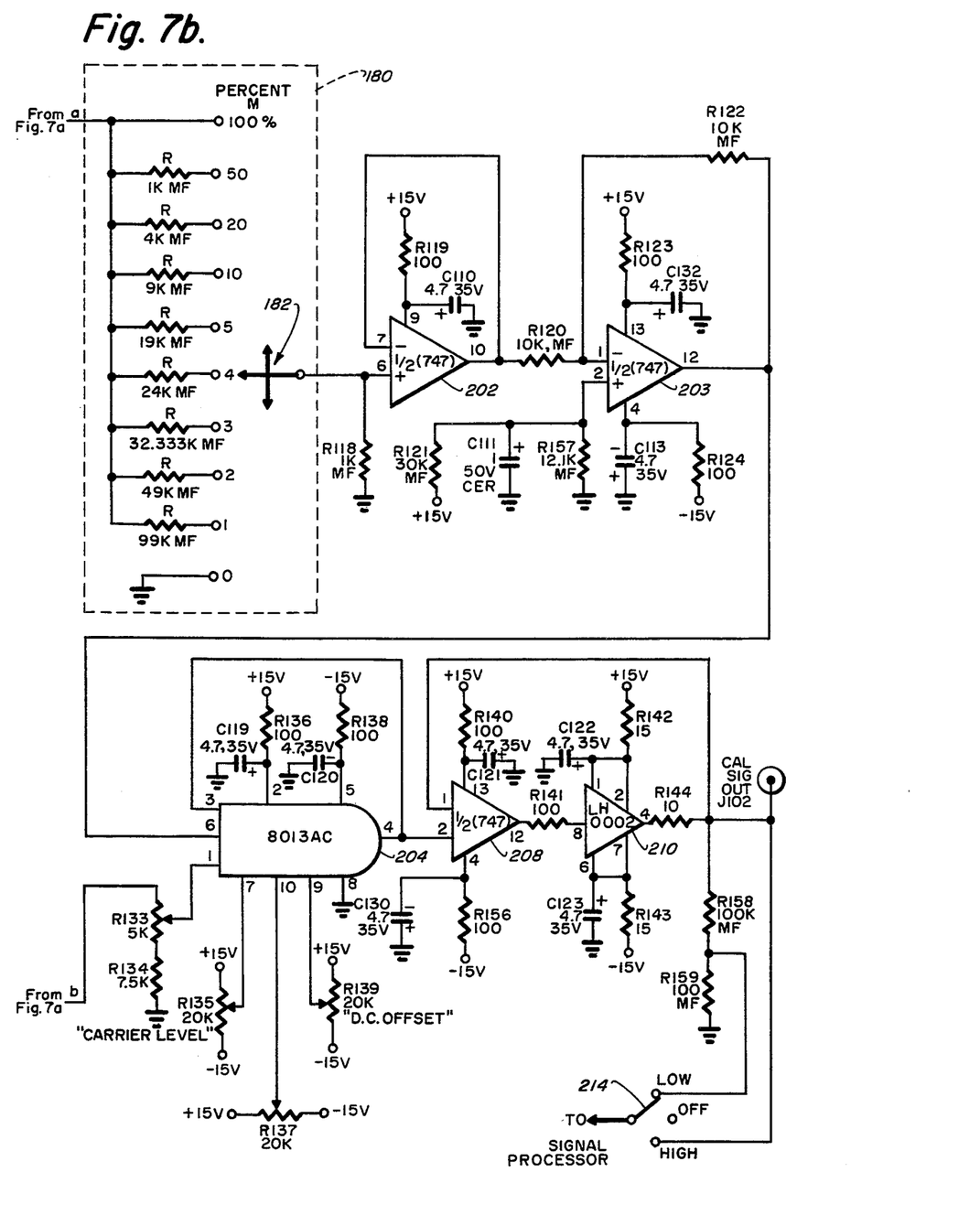

The calibration generator shown in schematic diagram form in FIGS. 7a and 7b provides an amplitude-modulated signal that is used to calibrate the spectrum analyzer or other readout device used with the noise signal processing system. The modulation index of the output signal is set by step attenuator 180 to precise levels of 0, 1, 2, 3, 4, 5, 10, 20, 50 and 100 percent by rotary switch 182 (FIG. 7b).

Oscillator 184 (FIG. 7a) and its associated components generate a 1-Hz sine wave signal, with the frequency trimmed to the required accuracy by selecting appropriate values for capacitors 186, 188 and 190. The values shown have been found to be satisfactory. Similarly, 20-Hz signals are generated by oscillator 192 and a 12-kHz carrier is generated by oscillator 194.

High-frequency modulation (20 Hz) or low-frequency modulation (1 Hz) is selected by means of switch 62. The desired signal is amplified by amplifiers 198 and 200 to produce a low output impedance to drive the passive attenuator network 180. Amplifiers 202 and 203 buffers the output of attenuators 180 and provides a DC component to the modulating signal, which is necessary for the modulation process, as will be described herein below. The resulting signal becomes the modulating signal that is combined with the carrier in modulator 204.

The 12-kHz carrier signal generated by oscillator 194 is buffered by amplifier 206 and coupled through capacitor 208 to switch 210. Switch 210 is for selecting either a carrier generated by an external source or the output of the internal signal generator and connects the desired source to modulator 204.

Amplitude modulation is accomplished in modulator 204 by the multiplication of the two input signals and the insertion of carrier by introducing a DC offset in one of the inputs. The following equations explain the modulation process. The carrier is represented by:

$$V_c(t) = A_c \cos \omega_c t,$$

where $A_c$ is an amplitude term and $\omega_c = 2\pi f_c$, and the modulating signal is x(t), the desired amplitude modulated signal can be written as $$V(t) = A_c \cos \omega_c t + mx(t) A_c \cos \omega_c t,$$

where m is the modulation index. This is equivalent to:

$$V(t) = A_c \cos \omega_c t [1 + mx(t)].$$

By examining the second term, 1+mx(t), it is seen that if the proper DC offset is added to the modulating signal, the desired modulation can be accomplished by multiplication. Modulator 204 is an IC analog multiplier that is used for this purpose.

Amplifiers 208 and 210 provide a low-impedance output for the resulting AM signal. The output is then attenuated to obtain the low-level output. Both of these signals are made available to the processor input by means of switch 214.

It is to be understood that the values of the particular elements shown throughout the several drawings have been found to be satisfactory in practicing the invention.

Obviously many modifications and variations of the present invention are possible in the light of the above teachings. It is therefore to be understood that within the scope of the appended claims the invention may be practiced otherwise than as specifically described.

We claim:

1. In a signal processing apparatus for providing an output that is a direct quantitative readout of the amplitudes of various frequency lines that constitute the envelope of an amplitude modulated broadband noise signal, the combination comprising:

a source of noise signals containing modulation information of interest, band pass filter means connected to said noise source for selecting a noise band known to contain modulation information of interest, circuit control means connected to said band pass filter means and providing an output signal that has a constant amplitude for a period of time that is greater than the period of the modulating signal, first indicator means connected to the input of said circuit control means for indicating when the excursions of the signal into said circuit control means is within the range of said circuit control means, and detector circuit means connected to said circuit control means for detecting the envelope of said modulating signal.

2. The apparatus of claim 1 having further in combination, second indicator means connected to the input of said detector for indicating when the signal into said detector is within the amplitude range for the detection of said modulating signal.

3. The apparatus of claim 1 having further in combination, second indicator means connected to the input of said detector for indicating when the signal into said detector is within the amplitude range for the detection of the envelope of said modulating signal.

4. The apparatus of claim 1 wherein said control circuit means include multiplier circuit means for providing an overall gain that is the inverse square of the control voltage.

5. The apparatus of claim 4 further including integrator means for integrating the control voltage for said control circuit means with a time constant of sufficient duration to prevent said control circuit from following the modulation envelope.

6. The apparatus of claim 5 wherein the multiplier function of said multiplier circuit is $V_x V_y / kI_z$, where $V_x$ and $V_y$ are the input signal and $kI_z$ is the loop control voltage.

7. The signal processing apparatus of claim 1 having further in combination a source of known modulated carrier signal for calibrating said signal processing apparatus.

8. The apparatus of claim 2 wherein said control circuit means includes multiplier circuit means for providing an overall gain that is the inverse square of its control voltage.

9. The apparatus of claim 8 further including in combination means for integrating said control voltage with a time constant of sufficient duration to provide a regulated output signal independent of the modulation envelope of the input signal to said control circuit means.

10. The apparatus of claim 9 wherein the output signal of said control circuit means is regulated to within ± one dB.

* * * * *